US009202588B1

(12) United States Patent
Kohli et al.

(10) Patent No.: US 9,202,588 B1
(45) Date of Patent: Dec. 1, 2015

(54) 1T COMPACT ROM CELL WITH DUAL BIT STORAGE FOR HIGH SPEED AND LOW VOLTAGE

(71) Applicant: NXP B.V., Eindhoven (NL)

(72) Inventors: Rajat Kohli, Kalkaji (IN); Patrick Van de steeg, Eindhoven (NL); Jwalant Mishra, Bangalore (IN); Pankaj Agarwal, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/494,263

(22) Filed: Sep. 23, 2014

(51) Int. Cl.
*G11C 17/00* (2006.01)
*G11C 17/12* (2006.01)

(52) U.S. Cl.
CPC ........................ *G11C 17/12* (2013.01)

(58) Field of Classification Search
USPC ...................... 365/104, 103, 63, 94
See application file for complete search history.

(56) References Cited

U.S. PATENT DOCUMENTS

| 5,917,224 | A | | 6/1999 | Zangara | |
|---|---|---|---|---|---|
| 6,002,607 | A | * | 12/1999 | Dvir | G11C 11/5692 365/103 |
| 7,002,827 | B1 | | 2/2006 | Sabharwal et al. | |
| 8,422,262 | B2 | | 4/2013 | Nevers | |
| 2002/0091894 | A1 | * | 7/2002 | Garg | G11C 17/16 711/103 |
| 2010/0157649 | A1 | * | 6/2010 | Brown | G11C 17/12 365/104 |

* cited by examiner

*Primary Examiner* — Vu Le

(57) ABSTRACT

Disclosed is a ROM memory device including a plurality of rows and columns of memory cells, each memory cell including a bit line pair and a transistor to store two bits of data therein, and a virtual ground line disposed between adjacent pairs of bit line pairs, wherein the bit line pair and virtual ground line are used to read data stored in the memory cells.

20 Claims, 15 Drawing Sheets

TABLE 2

| BITCELL => | Y0 | Y1 | Y2 | Y3 | Y4 | Y5 | Y6 | Y7 | BLt | CELL67 BL7 | BL6 | CELL45 BL5 | BL4 | CELL23 BL3 | BL2 | CELL01 BL1 | BL0 | BLt | CELL67 BL7 | BL6 | CELL45 BL5 | BL4 | CELL23 BL3 | BL2 | CELL01 BL1 | BL0 | BLt | CELL67 BL7 | BL6 | CELL45 BL5 | BL4 | CELL23 BL3 | BL2 | CELL01 BL1 | BL0 | BLt |
|---|---|---|---|---|---|---|---|---|---|---|---|---|---|---|---|---|---|---|---|---|---|---|---|---|---|---|---|---|---|---|---|---|---|---|---|---|
| | 1 | 0 | 0 | 0 | 0 | 0 | 0 | 0 | Z | Z | Z | Z | Z | Z | Z | Z | RD | 0 | Z | Z | Z | Z | Z | Z | Z | RD | 0 | Z | Z | Z | Z | Z | Z | Z | Z | Z |
| | 0 | 1 | 0 | 0 | 0 | 0 | 0 | 0 | 0 | Z | Z | Z | Z | Z | Z | RD | 0 | Z | 0 | Z | Z | Z | Z | Z | RD | 0 | Z | 0 | Z | Z | Z | Z | Z | Z | Z | Z |
| | 0 | 0 | 1 | 0 | 0 | 0 | 0 | 0 | Z | Z | Z | Z | Z | Z | RD | 0 | Z | Z | Z | Z | Z | Z | Z | RD | 0 | Z | Z | Z | Z | Z | Z | Z | Z | Z | Z | Z |
| | 0 | 0 | 0 | 1 | 0 | 0 | 0 | 0 | Z | Z | Z | Z | Z | RD | 0 | Z | Z | Z | Z | Z | Z | Z | RD | 0 | Z | Z | Z | Z | Z | Z | Z | Z | Z | Z | Z | Z |
| | 0 | 0 | 0 | 0 | 1 | 0 | 0 | 0 | Z | Z | Z | Z | RD | 0 | Z | Z | Z | Z | Z | Z | Z | RD | 0 | Z | Z | Z | Z | Z | Z | Z | Z | Z | Z | Z | Z | Z |
| | 0 | 0 | 0 | 0 | 0 | 1 | 0 | 0 | 0 | Z | Z | RD | 0 | Z | Z | Z | Z | Z | 0 | Z | RD | 0 | Z | Z | Z | Z | Z | 0 | Z | Z | Z | Z | Z | Z | Z |
| | 0 | 0 | 0 | 0 | 0 | 0 | 1 | 0 | Z | Z | RD | 0 | Z | Z | Z | Z | Z | Z | Z | RD | 0 | Z | Z | Z | Z | Z | Z | Z | Z | Z | Z | Z | Z | Z | Z |
| | 0 | 0 | 0 | 0 | 0 | 0 | 0 | 1 | Z | RD | 0 | Z | Z | Z | Z | Z | Z | Z | RD | 0 | Z | Z | Z | Z | Z | Z | Z | Z | Z | Z | Z | Z | Z | Z | Z |

BIT0: CELL67, CELL45, CELL23, CELL01
BIT1: CELL67, CELL45, CELL23, CELL01
BIT2: CELL67, CELL45, CELL23, CELL01

1T COMPACT ROM CELL WITH DUAL BIT STORAGE FOR HIGH SPEED AND LOW VOLTAGE

TECHNICAL FIELD

Various embodiments disclosed herein relate generally to single transistor read only memory (ROM) bitcells and methods of reading data stored therein.

BACKGROUND

A Mask Read Only Memory (Mask ROM) is a semiconductor memory device in which data is coded during a manufacturing process. There are various types of manufacturing processes to program a Mask ROM such as diffusion, metallization, and via processing. In diffusion processing, a Mask ROM is programmed during a diffusion process in a semiconductor substrate. In an embedded metal programmable ROM, ROM data is programmed during a metal/metallization process. In a via programmable ROM, which is similar to the embedded metal programmable ROM, ROM data code is programmed during a via forming process.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

According to one embodiment, there is provided a ROM memory device, including a plurality of rows and columns of memory cells, each memory cell including a bit line pair and a transistor to store two bits of data therein, and a virtual ground line disposed between adjacent pairs of bit line pairs, wherein the bit line pair and virtual ground line are to read data stored in the memory cells.

Each bit line of a bit line pair may double as a virtual ground line. The virtual ground line may be a dedicated virtual ground line.

The ROM memory device may include at least one column of memory cells that include a bit line pair.

A first bit line of the bit line pair may be grounded in order to read data from a second bit line of the bit line pair. The transistor may be an NMOS or a PMOS transistor with appropriate logic levels.

The ROM memory device may include a virtual ground generation circuit to control polarities of the bit line pairs.

The ROM memory device may include a column multiplexer having a predetermined number of inputs, wherein the bit line pair and virtual ground line are inputs of the column multiplexer.

Inputs to the column multiplexer that are not grounded or being read may be in a do not care state.

A memory cell may be read by controlling the virtual ground line and a polarity of a first bit line of the bit line pair in order to read a value of a data bit on a second bit line of the bit line pair.

The ROM memory device may include a virtual ground generation circuit to control the polarity of the first bit line. The virtual ground line, first bit line and second bit line may be inputs to a column multiplexer having a predetermined number of inputs. A plurality of do not care values may be read from the plurality of predetermined inputs that are not being read or virtually grounded.

The virtual ground line and a second bit line may be controlled in order to read a value of a data bit on a first bit line.

According to an additional embodiment, a ROM memory device may include a plurality of column multiplexers having a plurality of rows and columns of memory cells including a transistor to store two bits of data therein, a plurality of bit line pairs, each bit line pair including a first bit line and a second bit line on either side of the transistor, and an additional bit line disposed between pairs of column multiplexers.

Multiple bit lines may be used to read the two bits stored in the transistor. Three bit lines are virtually grounded to read data stored on a fourth bit line. Data read from multiple bit lines are multiplexed to form a single output bit. Bit line inputs to a column multiplexer that are not virtually grounded or read may be kept at a high impedance state.

The ROM memory device may include a virtual ground generation circuit to program values of the bit lines.

BRIEF DESCRIPTION OF THE DRAWINGS

Embodiments of the invention are described in more detail and by way of non-limiting examples with reference to the accompanying drawings, wherein:

FIG. 12 illustrates a first programming table in accordance with embodiments described herein; and FIG. 13 illustrates a second programming table in accordance with embodiments described herein.

DETAILED DESCRIPTION

Figure 1:
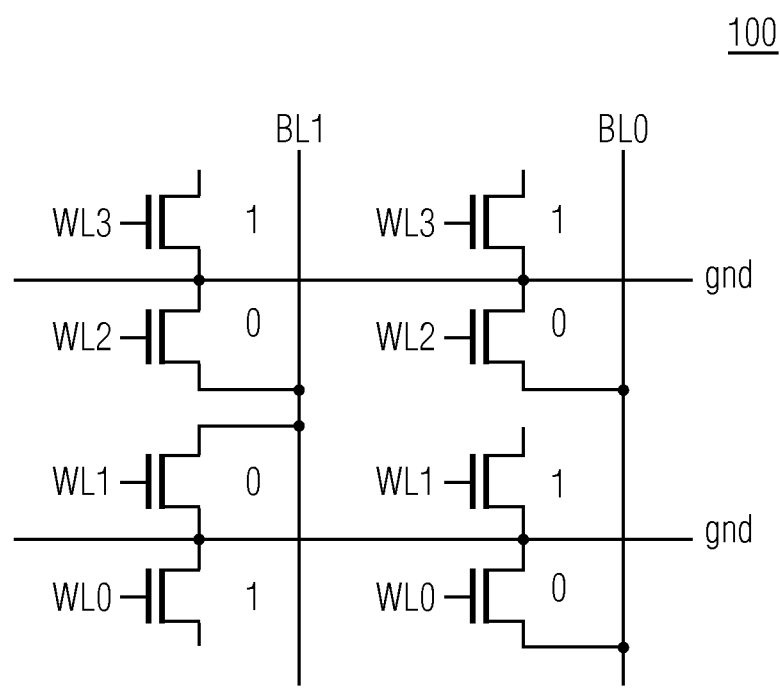
FIG. 1 illustrates a schematic diagram of a related art source-connected NOR type ROM cell.

It should be understood that the figures are merely schematic and are not drawn to scale. It should also be understood that the same reference numerals are used throughout the figures to indicate the same or similar parts.

The descriptions and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Designs of single transistor ("1T") ROM bitcells attempt to achieve high quality memory devices while balancing characteristics such as bitcell density, device width, memory speed, and read voltage.

To achieve a high density ROM bitcell array, device width is kept low, usually at the minimum level supported by processing technology. This small width leads to increased spread of a MOS transistor, which can negatively impact the performance (speed) of the memory.

Conversely, for achieving high speed and enhanced low voltage operation (Vddmin), the device width has to be kept larger. The larger width reduces the spread of the MOS transistor, which can then negatively impact the density of the memory.

It would be advantageous to have a single transistor ("1T") ROM bitcell that can store more data while not increasing the bitcell density nor device width, and still perform at high speed.

A ROM using a 1T cell stores a single bit of data at a time. While using minimum feature sizes is often beneficial, the smaller sizes often allow more variation, such as random dopant fluctuations, which can limit low voltage operation.

Related art high density ROM bitcell arrays have columns in which adjacent bitcells are formed to share a source/drain connection and connect to an adjacent bit line or virtual ground line.

FIG. 1 illustrates a schematic diagram of related art a source-connected NOR type ROM cell 100. In this figure, a 4×2 array implementation is illustrated in which decent density of cells is achieved by sharing source nodes and connecting these nodes to ground. When a particular bit line is charged (e.g., BL1) and a particular word line enabled (e.g., WL2), then the transistor located at the intersection of those lines will manifest the logical "0" encoded by its drain connection at BL1. In this arrangement, when a drain connection is connected to a BL, logic 0 is read. When there no drain/BL connection, the drain floats and logic 1 is read on the BL.

In this configuration, NMOS width is kept low to achieve a good cell density, but the device manifests slower speed, poor spread and is not good for low voltage applications. There are various ways through which the ground and bit lines are connected to the bitcell. The ground lines are disposed horizontally and connect each of the source/source terminals of a pair of transistors. Thus a large number of ground lines must be provided, and in order to program the bitcells in this arrangement, a large amount of connections must be made.

In the minimum size transistors illustrated in FIG. 1, small device width does not always lead to fast device speed, because the device width leads to the variability of the design. When having small dimensions, any parameters, such as current through the device, will lead to high variability, meaning robustness will not be maximized, which will hinder device performance. The variability is inversely proportional to the square root of the area of the device. Larger devices equate to less variability, reduction of margins, and higher reliability.

Figure 2:
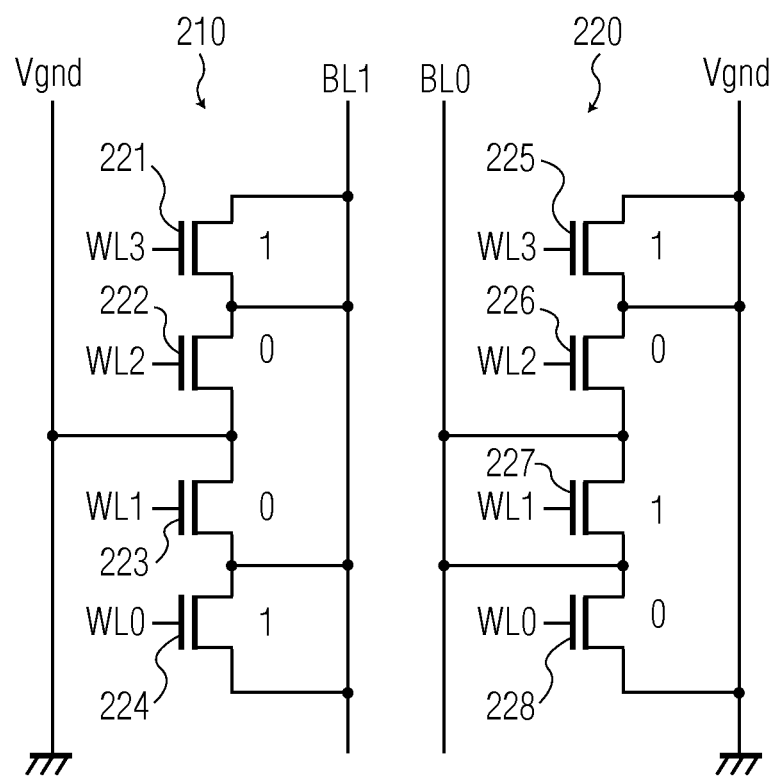
FIG. 2 illustrates a schematic diagram of a related art source and drain connected NOR type ROM cell.

FIG. 2 illustrates a schematic diagram of a related art source and drain connected NOR type ROM cell 200. As illustrated in FIG. 2, a ROM array is disclosed in which columns of bitcells (210, and 220, for example) each use a separate virtual ground line. Each 1T bitcell stores 1 bit of data. MOS transistors 221-224 are disposed in bitcell column 210 and MOS transistors 225-228 are disposed in bitcell column 220.

In the arrangement illustrated in FIG. 2, a high density of cells is achieved in the vertical direction by virtue of adjacent bitcells in each column sharing source or drain (generically referred to herein as "drain") connections. These drain connections connect each transistor in each column to either a virtual ground line or to a bit line associated with that particular column. A virtual ground line may be disposed between adjacent pairs of bit line pairs.

For example the two transistors 226 and 227 illustrated in column 220 share a common drain connection to bit line BL0. Transistor 226 shares a drain connection with the transistor 225 above it to virtual ground line Vgnd 2, while transistor 227 shares a drain connection with the transistor 228 below it to bit line BL0.

Each transistor encodes a logical "0" by one drain connection connecting to each kind of line (BL or Vgnd), and encodes a logical "1" by both its drain connections connecting to the same kind of line (BL or Vgnd). Thus when a particular bit line is charged (e.g. BL0) and a particular word line enabled (e.g. WL2), then the transistor located at the intersection of those lines (in this example transistor 226) will manifest the logical "0" encoded by its drain connections by discharging bit line BL0 onto virtual ground line 2. Conversely if word line WL1 were enabled instead (in order to read transistor 227), no significant discharge of the bit line would occur (both drains of transistor 227 connect to the same line), indicating a logical "1" encoded by its drain connections. It will be understood that the encoding of "1" and "0" described above is merely a choice and could be inverted.

In the device structure illustrated in FIG. 2, for a single bitcell, two metal tracks are required over the bitcell. Due to this structure, the NMOS width can be kept high, on the order of about two times the minimum processing width. This structure has a faster operation, reduction of spread, use of lower Vdd, and increased area. Regarding layout, there are various ways through which ground and bit lines are connected to the bitcell. However, because each column of bit lines uses a separate virtual ground line, the number of tracks is increased and density is compromised.

The larger the device, as illustrated in FIG. 2, the higher the cell current, and the faster the device speed. This is especially true for analog devices. Larger devices result in reduced variability.

Embodiments described herein below store two bits of data in one physical width/bit, and thus high density is preserved.

Figure 3:
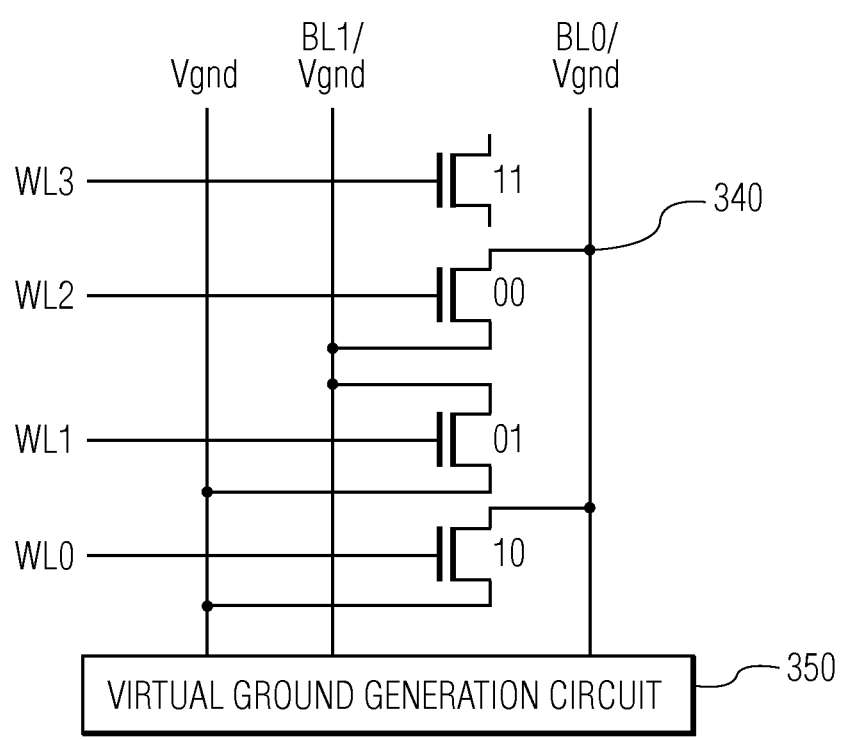
FIG. 3 illustrates a schematic diagram of an NMOS type NOR ROM cell of an embodiment.

FIG. 3 illustrates a schematic diagram of an NMOS type NOR ROM cell 300 of a further embodiment. FIG. 3 illustrates a parallel or NOR type ROM cell using NMOS transistors in a 4×2 data array including four word lines WL0-WL3. The cell 300 includes two bit lines BL0/vgnd and BL1/vgnd that make use of a virtual ground generation circuit ("VGGC") 350 to control polarities thereof. Though a small array is illustrated here, memory arrays of various sizes may be used, spanning from the hundreds to thousands to millions of transistors, WLs and BLs to store up to megabits of data. A column of four bitcells are arrayed between BL0/vgnd and BL1/vgnd. Each bitcell may be used to store two bits of data using a single MOS transistor.

As illustrated, four transistors are connected in different configurations to BL0/vgnd, BL1/vgnd and a dedicated virtual ground line (Vgnd). In order to conserve space and increase density on a semiconductor chip, bit lines BL0 and BL1 are used as virtual ground lines at appropriate times to read data from a bitcell. This additional ability allows more versatility of the circuit and provides a new way to read two-bit data stored with a single MOS transistor.

Thus, bit lines BL0/vgnd and BL1/vgnd serve multiple purposes. One bit of data may be directly read onto bit lines BL0 or BL1 from a bitcell, or polarities of BL0/vgnd and BL1/vgnd may be controlled using the VGGC 350 to assist in reading another bit of data from the same bitcell. VGGC 350 may change a bit line's voltage level from a first logic voltage state, such as Vdd, to a second logic voltage state, such as Vss, upon receiving a read signal. Each bit line of a bit line pair may double as a virtual ground line at an appropriate time determined by the VGGC 350.

A single bitcell is shared between two bit lines. Structurally, with a single bitcell, two metal bit line tracks are required over it. Due to this configuration, the NMOS width can be kept high, on the order of two times the minimum width. This width allows better device characteristics than smaller devices, such as increased speed, reduced spread, lower Vddmin, and the ability to store more data than devices of the same or similar size.

Figure 5:
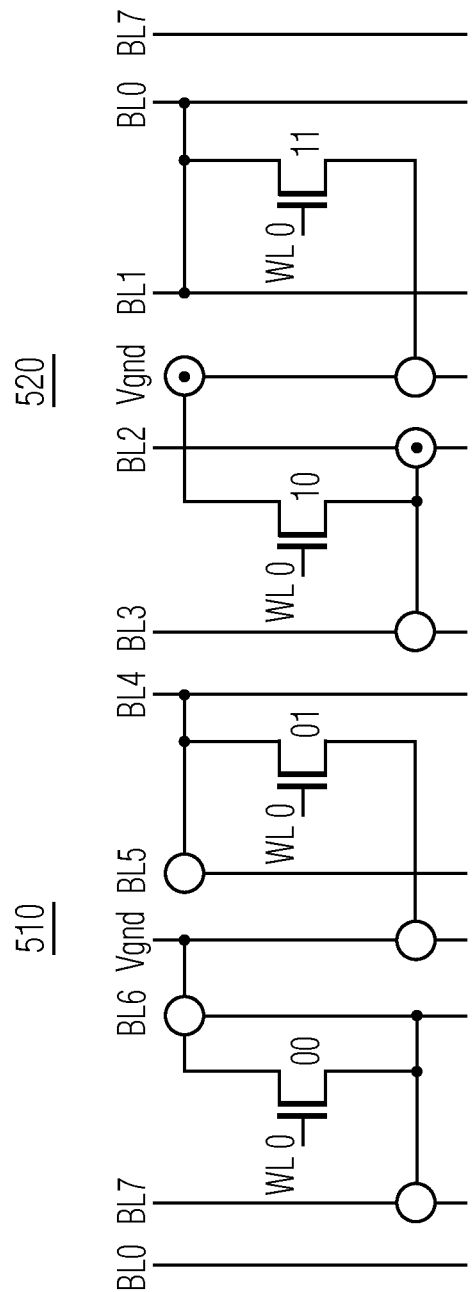
FIG. 5 illustrates a schematic diagram of a column-row configuration in accordance with FIG. 3.

To achieve good density the Vgnd track is shared with an adjacent bitcell column (illustrated in FIG. 5). Using Vgnd and the virtual ground generation circuit 350, one data out of the two data bits stored can be read at a time. Differing from related art FIGS. 1 and 2 that use a single bit line per memory cell in a column of memory cells, embodiments described herein use two bit lines in a column to form a memory cell. Though illustrated using NMOS transistors, similar implementations can be performed using PMOS transistors.

FIG. 3 illustrates how 2 bit data is stored in a single ROM cell using the single MOS transistor array 300. The virtual ground generation circuit 350 controls the polarity to be displayed on the three lines Vgnd, BL1/vgnd and BL0/vgnd at any given time in order to read a bit. The dots arrayed on BL0, BL1 and Vgnd represent ground-connected vias that have been inserted at a time of forming the given Mask ROM.

Explanation will now be given to read the data stored in the memory array 300, for example, to read 00 at WL2. To read 0 on BL0, there is a via connected to ground for the MOS at bitcell 2. To read a data bit from BL0, BL1/vgnd must be grounded through VGGC 350 in order to create a path to ground through the MOS to BL0. To read the second 0 from BL1, the VGGC 350 will short BL0 to ground, and because a via ground pad has been inserted to connect to BL1, a second logic 0 can be read at BL1. When the ROM array is initially written, the layout of vias and floating connections is stored, and this layout design is used in conjunction with the VGGC 350 to read from BL0 or BL1 when various bitcell addresses are selected.

With the use of a ROM programming utility, the programming is done at the manufacturing step. A mask is provided based upon the customization strategy. The strategy could be one mask programmable or multiple mask programmable. With the use of software, determinations are made where to land a via and where not to land a via, and that physical mask will be used when the ROM is fabricated, and hence it will be programmed.

To read any combination of two bits using a single MOS, three lines are used, a dedicated virtual ground line that is shared between two columns of bitcells (as illustrated in FIG. 5), a BL1/Vgnd line and a BL0/Vgnd line. BL1/Vgnd line has a dual function as controlled by VGGC 350. BL1/Vgnd can act as BL1 when desiring to read a 0 or 1 on BL1, or BL1/Vgnd can be shorted to virtual ground when desiring to read a 0 or 1 on BL0. BL0/Vgnd line performs a mirrored function for BL0 and BL1.

In former embodiments, reading 00 meant there had to be two separate WLs for BL1 and BL0, and two bit lines. In this embodiment, there is only one MOS and that MOS is responsible to store 0 for BL1 also 0 for BL0, which is illustrated as 00 in FIG. 3 for example. The first 0 belongs to BL1 and the second 0 belongs to BL0. And the other combinations 01, 10, 11, illustrate that any combination can be stored by connecting appropriately the connections between the MOS drain and source, the BL/vgnds and Virtual Ground 330.

As is known in the art, the ROM memory cell 300 will be programmed once using a code. An address will be determined for each bit and vias will be dropped into place wherever a logic 0 is desired to be read. Horizontal lines are representative of metal lines. The dots 340 represent vias. If the via is illustrated, then it stores a 0. If there is no dot, there is no via, and a logic 1 is stored. The circles are the programmable points. Thus, a ROM memory array is originally programmed to represent all 1's. When a via is dropped at a particular location, a logic 0 may be read at that location.

ROM cell 300 stores information in a static format, not in a dielectric format. This means that either a node will be connected to ground, or it will remain floating, as illustrated in FIG. 3. If a drain or source is not connected to a BL, then a "1" polarity of information will be stored. If the drain or source is connected to a BL, then a "0" polarity of information will be stored. In the latter configuration, one of the terminals will be connected to a BL, and the remaining terminal will be connected to ground, so there will be a connection from BL to ground. In the embodiments described herein, this is done in such a way that two bits of information can be stored on a physical MOS. The polarities of the connections may be alternatively programmed. Instead of a via/ground signifying a logic "0", connecting a bit line to a via/ground could also be programmed to represent a logic "1", while a floating connection could be programmed to represent a logic "0".

Figure 4:
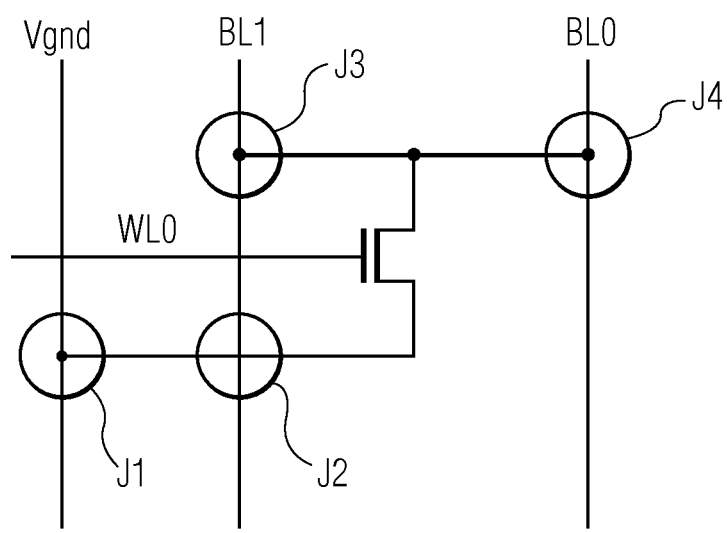
FIG. 4 illustrates a schematic diagram of via connections in accordance with FIG. 3.

FIG. 4 illustrates a schematic diagram of possible via connections in accordance with FIG. 3. One bitcell may store two data bits simultaneously. In embodiments described herein, the Vgnd track may be shared with an adjacent bitcell (as illustrated in FIG. 5). Junctions J1-J4 illustrate the junctions where a via may be placed (based on the data to be stored) in order to program the ROM content.

Thus, junctions J1-J4 illustrate nodes where a via maybe dropped to indicate a logic 0. To store a connection, a cell programmer will decide whether or not to insert a via at one of these junctions, to represent a logic 0 when read. If no vias are dropped, the unconnected source and drain regions of the NMOS transistor will float and will be read at logic 1.

A via maybe inserted on BL1 at J3 for example along metal line ML1. That means it will be storing data based on other connections. If a via is dropped at junction J3, either of J1 or J2 will be programmed (have a via). Combinations of J1/J2 and J3/J4 cannot simultaneously have a via, else a physical short will be created between Vgnd and BL1 or between BL1 and BL0. Each J1/J2 or J3/J4 pair represents a metal line, and both ends of the metal line cannot have a via at the same time. Thus, any two of the three lines must be grounded at one time in order to read a data bit, and these connections are stored in the VGGC 350.

The VGGC 350 aids in reading the ROM. When reading data stored at BL0, programming logic stored in the VGGC instructs BL1 to be grounded. If a via has been dropped at BL0, the read value will be 0. If no via had been dropped, the read value will be 1. To read data stored at BL1, BL0 will be shorted to ground using the VGGC.

Thus one physical MOS device can be used to store information for two adjacent BLs. To read one BL, the other BL has to be pulled down to ground by the VGGC. Otherwise the bitcell cannot be read. In the related art, additional grounds and vertical lines are required, every alternate BL. These extra lines increase the amount of area used for the memory devices.

In embodiments described herein, existing BLs are programmed to act as BLs and as virtual grounding lines at different times to maximize space available. Therefore additional ground lines are not used and device density is increased. Existing BLs are used as virtual ground circuitry, and the existing bit lines are switched in such a way, when required, that they act as virtual ground and thus eliminate the purpose of having additional virtual ground lines for every bit line column.

FIG. 5 illustrates a schematic diagram of a column-row configuration in accordance with FIG. 3. Illustrated in FIG. 5 is a 1×8 (1 row (WL), 8 columns (BL)) of data. As illustrated in FIG. 5, the Vgnd tracks 510 and 520 are respectively shared between two MOS transistors. Thus, bit lines BL0-BL7 can each be connected to virtual ground based on the read operation performed on a selected BL. A column multiplexer of 8 is illustrated. One out of eight bit lines is selected at a time to output a bit from memory. Two bit lines are respectively used to form two bits of data. Two bit lines may be referred to as a bit line pair. Each memory cell may include a bit line pair and a transistor to store two bits of data therein.

The column as illustrated in FIG. 5 represents a vertical stack of the bitcell laid out in a horizontal fashion. All four cases 00, 01, 10 and 11 are illustrated regarding what connections are used to read each of two bits of data from each bitcell. As discussed previously, the circuit dot is a via that is inserted during the programming phase of the ROM.

As illustrated in FIG. 5, the BLs that have a via connected to BL2, BL5, BL6 and BL7, representing logic 0 stored. The BLs that do not have a via connected include BL0, BL1, BL3 and BL4, representing logic 1 stored. To read the data stored in one BL, the other BL/vgnd connection has to be shorted with Vgnd as disclosed in embodiments described herein. FIG. 5 illustrates how the connections should look. Based on the connection rules regarding where to place a via as illustrated in FIG. 4 and the programming scheme outlined in Table 1, data stored in a ROM in accordance with embodiments described herein can be read and determined.

Figure 12:
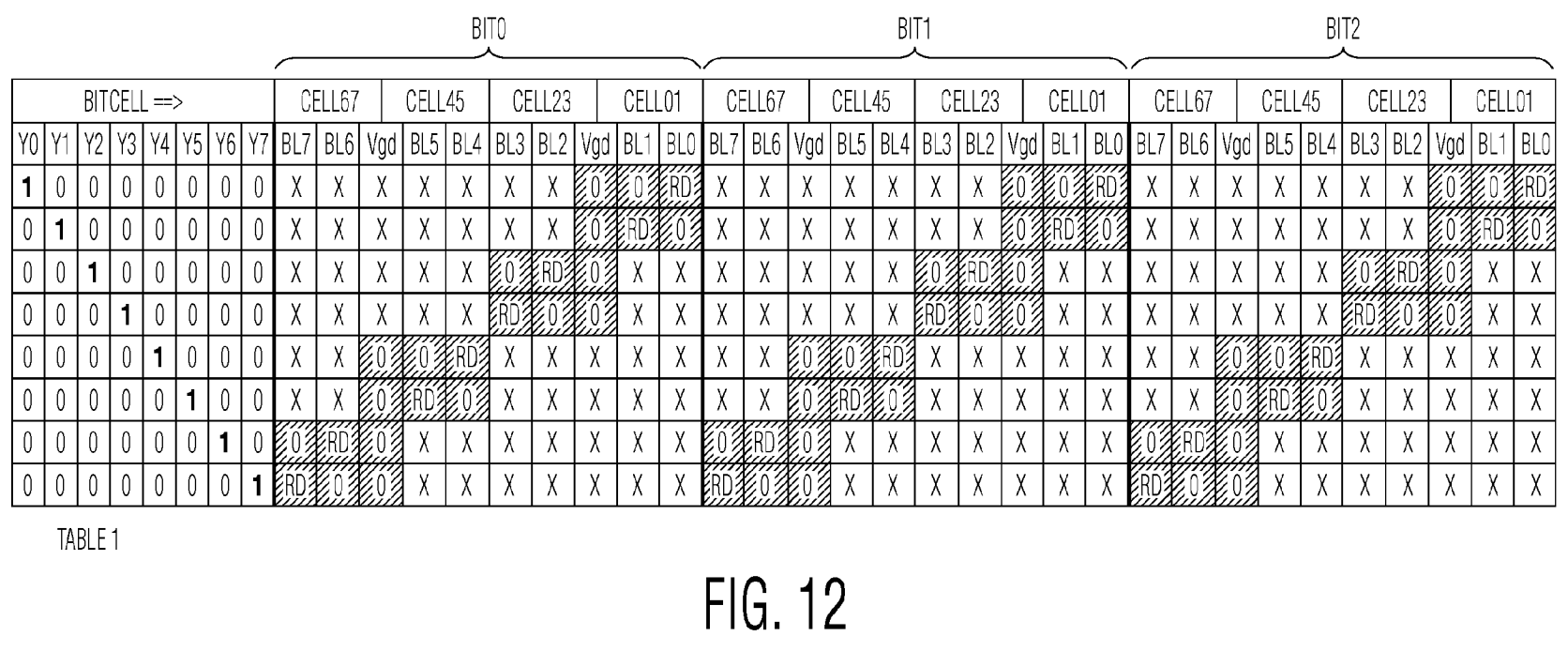

FIG. 12 illustrates a programming Table 1 in accordance with embodiments described herein.

In a read operation, though each bitcell simultaneously stores two bits of data, these two bits are not read at the same time. To read data stored in the column array of FIG. 5, for example, first the 0 of BL7 is read, then the 0 of BL6 is read, and so on. Externally the read cycle may look like a normal ROM read cycle. Internally, however, data is stored and read in an entirely different fashion that what has heretofore not been known in the art.

Table 1 illustrates how BL/vgnd lines and the dedicated Vgnd line should be programmed to read from each bit line in a ROM memory array in accordance with embodiments described herein.

Table 1 illustrates the bitcells to be programmed by the VGGC 350. Y0-Y7 represent addresses output from a column decoder that corresponds to the eight bit lines reading two bits of data from the four bitcells illustrated in FIG. 5. Data from the bitcells may be multiplexed and output to represent various memory bits stored in ROM. Thus a column multiplexer may have a predetermined number of inputs, and a bit line pair and virtual ground line are inputs of the column multiplexer.

Referring to FIG. 5 and Table 1, a read signal may be received at WL0 to read the data stored at BL2, for example. BL2 is a data bit associated with bitcell 23 of BIT0. BL2 corresponds to column Y2 decoded by a column decoder (not illustrated). The column decoder receives a read command and accesses column Y2. The address 1 in column Y2 specifies that BL3 and Vgnd must be respectively grounded to read data stored at BL2. RD refers to a read operation on a BL. The output of a RD operation can be a 1 or a 0, depending on how a memory has been programmed. If the memory had been programmed as illustrated in FIG. 5, when the column decoder selects address Y2, because BL2 has a via connected thereto, the logic read there from will be 0, and logic 0 will be read as BIT0 in the memory array.

Referring to FIG. 5 and Table 1. When Y2=1, the VGGC specifies that BL3 should be grounded. A discharge path is then created through the MOS and the 0 may be read from BL2. The intelligence of Table 1 is programmed into the VGGC, which can be implemented in many ways. When reading the value of a single bitcell, only two other bitcells are programmed. The X's in Table 1 represent "do not care" values and have no influence on the read operation. The values of the do not cares (X) can be indiscriminately 0s or 1s and these values do not affect the outcome of the read operations.

The programming of Table 1 repeats itself for every bit series of BL0-BL7, depending on how big a memory is designed to be. Thus, the memory is scalable. If there is a column multiplexer decoding of 8, Y0 to Y7 is used. The column decoder can be scaled Y0 to Y3, Y0 to Y15 or Y0 to Y31, and so on. There is no limit on the size of the memory.

FIG. 5 thus illustrates a repetition of three conductive lines. Two BL/vgnds and one dedicated ground line that is inserted between each column of bitcells. In column decoding, the design is to select one BL out of eight BLs, and there is multiplexing inside a memory which has eight lines. If Y4 is high, a read operation will be performed on BL4, which will bring the output of BL4 to BIT0. BIT0 can thus have eight addresses, for example, and data can be stored in that bit. This is how eight different data values may be accessed out of BIT0. When Y0=1, there is one data coming out of BIT0. When Y1=1, another data value is read, and so on. Thus, eight different data values can come out of BIT0 based on the column decoding.

As discussed herein, the read schemes depend on the programming of neighboring BLs to a selected BL. For example when reading column Y2, BL2 from bitcell 23 is being read. Logic 0 is read, which means the virtual ground circuitry has to make sure that the other lines from cell 23 are correctly polarized as BL3=0 and Vgnd=0. Table 1 thus illustrates the dependency relationships of the three lines. When reading from BL3 in bitcell 23, corresponding to column Y3, BL3 is being read, thus BL2 and Vgnd are pulled to ground. Thus, BITs 0, 1, 2, etc. can be programmed for 0 or 1 based on the RD square in Table 1. The table shows what the condition for the neighboring lines should be.

This read scheme can be implemented in various circuit designs as are known to those skilled in the art. Therefore a particular circuit design is not illustrated here. Table 1 is provided to demonstrate what current values should be associated with each line. Thus implementations of embodiments described herein are described at the technology level, but not at the implementation level, because those of ordinary skill in the art may implement the embodiments described herein using various types of circuits.

Figure 6A:
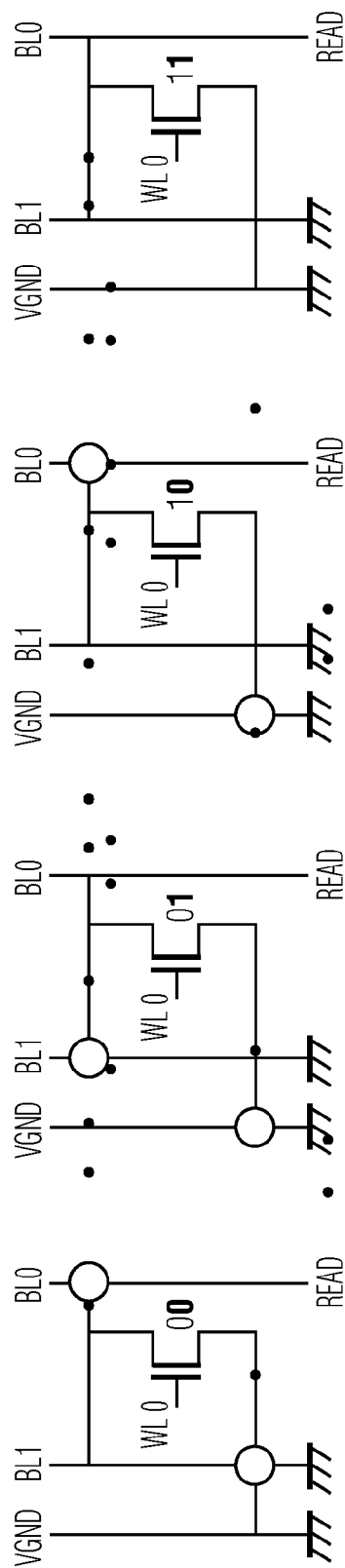
FIGS. 6A and 6B illustrate schematic diagrams of different read configurations in accordance with FIG. 3.
Figure 6B:
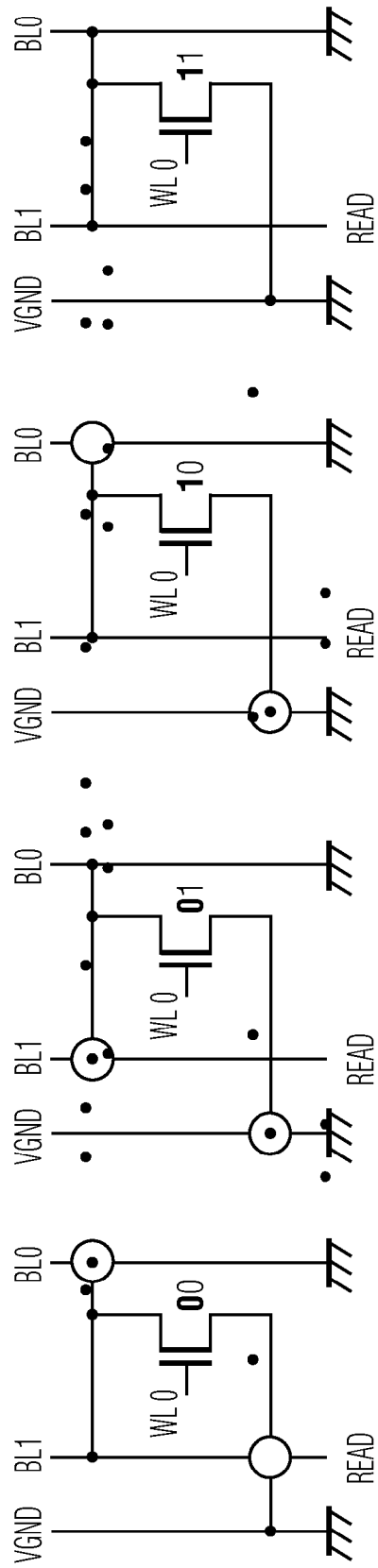

FIGS. 6A and 6B illustrate schematic diagrams of different read configurations in accordance with FIG. 3. FIG. 6 illustrates various possible combinations of data which can be stored in a bitcell, and how each 0 or 1 bit is read. A "read" label is placed below each bit being read. A via connected to a bit line being read represents a logic 0. No via or a floating connection at a bit line being read represents a logic 1. This is not an actual column array representation, but illustrates all possible combinations of data that can be stored and read.

Figure 7:
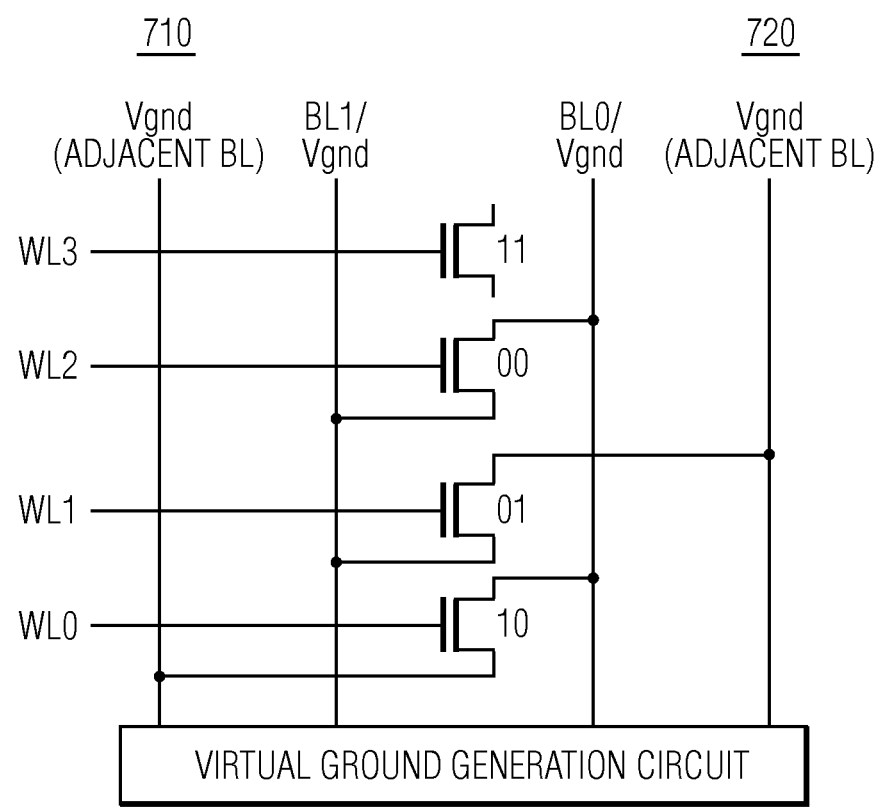
FIG. 7 illustrates a schematic diagram of a NOR type ROM cell using bit lines in accordance with a further embodiment.

FIG. 7 illustrates a schematic diagram of a NOR type ROM cell using bit lines in accordance with a further embodiment. Illustrated in FIG. 7 is a parallel or NOR type ROM cell in a 4×2 data array implementation. A bitcell column is shared between two bit lines BL0/vgnd and BL1/vgnd. For a single bitcell two metal tracks (bit lines) are required over it. Due to this configuration the NMOS width can be kept high, greater than two times the minimum width.

In this embodiment, to achieve good density, the Vgnd tracks 710 and 720 are not dedicated Vgnd lines, but are formed with bitlines of adjacent bitcells. All of the Vgnd connections are made with existing bit lines. In this arrangement, one extra track per column multiplexer decoder is required. Though NMOS transistors are used and displayed, similar implementations can be done using PMOS transistors. Benefits of the bitcell configuration illustrated in FIG. 7 are faster speed, reduced spread, lower Vddmin and comparable area with respect to embodiments described herein. In embodiments described herein, a plurality of column multiplexers may be implemented having a plurality of rows and columns of memory cells.

Figure 8:
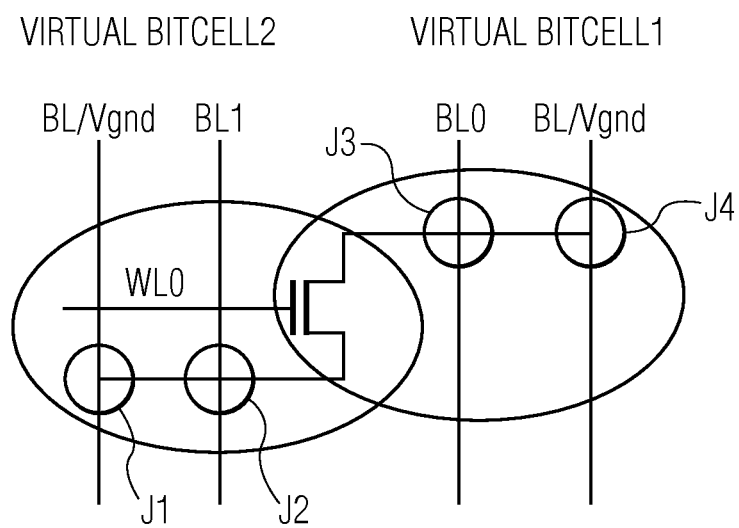
FIG. 8 illustrates a schematic diagram of via connections in accordance with FIG. 7.

FIG. 8 illustrates a schematic diagram of via connections in accordance with FIG. 7. FIG. 8 illustrates the layout correspondence of various nodes. One bitcell stores two data simultaneously. Vgnd may be generated using the adjacent bit lines which are not being read. Junctions J1-J4 shows the junctions where a via is placed (based on the data to be stored) in order to program the ROM content. Junctions J3 and J4 cannot be programmed at the same time and junctions J1 and J2 cannot be programmed at the same time, else data cannot be read. When reading from BL0, BL1 must be grounded to Vgnd by the VGGC. When Read from BL1, BL0 and BL/Vgnd on right side must be grounded to Vgnd by the VGGC.

Figure 9:
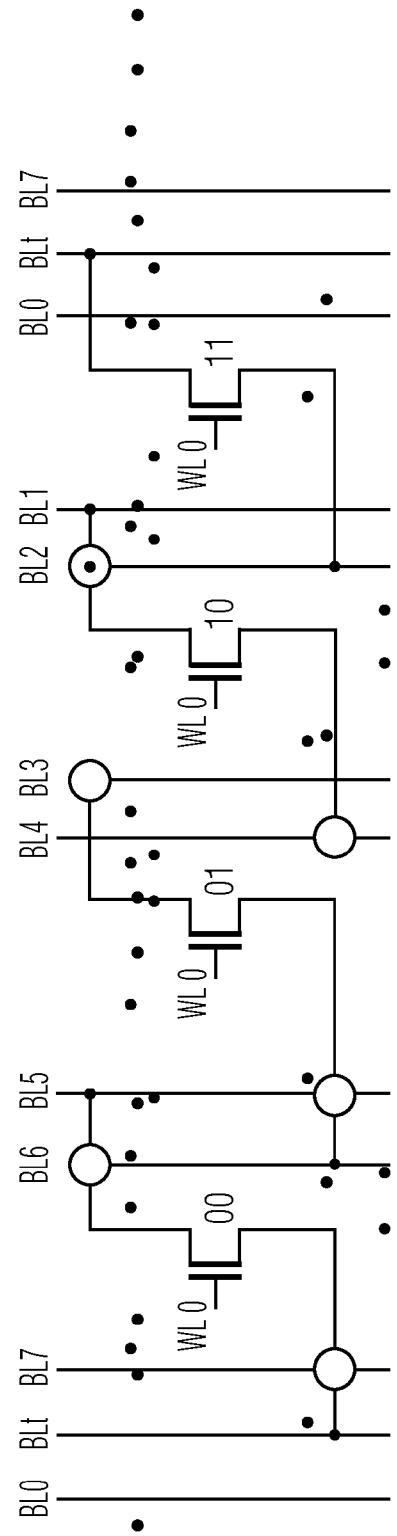
FIG. 9 illustrates a schematic diagram of a column-row configuration in accordance with FIG. 7.

FIG. 9 illustrates a schematic diagram of a column-row configuration in accordance with FIG. 7. In this embodiment, BL0 and BL1 are read in a similar manner as previously described. One difference is that the virtual ground track on a left and right of each BL pair is taken from the existing cell bit lines.

FIG. 9 illustrates a practical implementation of the connections described regarding FIG. 8. Regarding the case of reading 00, two vias are placed at BL6 and BL7. To read BL7, BL6 has to be grounded, and thus a via is formed at BL7. In the previous embodiment, after every two bit lines, a virtual ground line was required. Here, that line is not required. The drain connection gets a virtual ground connection from the existing BL5, if required, as illustrated in Table 2.

FIG. 13 illustrates a programming Table 2 in accordance with embodiments described herein.

In a previous embodiment, each bit line could represent either a bit line or a virtual ground line, and there was a dedicated virtual ground line. In this embodiment, three bit lines are taken as virtual ground connections and data is read from a fourth BL. In this embodiment there is no requirement to lay down an extra ground track.

For example, in a read operation on BL5, BL3 and BL4 are grounded by the VGGC. Similarly, to read BL4, BL5 and BL6 are virtually grounded. This is another difference from a previous embodiment. In this case, it must be ensured that two different BLs are grounded, instead of a bit line and Vgnd.

As illustrated in FIG. 9, implementation of an embodiment corresponds to 1×8 (1 row (WL), 8 cols (BL)) data, in which 1 out of 8 bit lines will be selected, and data 00, 01, 10, 11 can be stored in the manner illustrated herein. In this embodiment, one extra track (BLt) is required at end of a column multiplexer. As described above, BL0 to BL7 are connected to virtual ground based on the read operation performed on a selected bit line.

As a bitcell is capable of storing two data bits, there can be four possible combinations stored, i.e. 00, 01, 10, and 11. The data stored in a bitcell is also dependent on the generation of virtual ground on the required bit lines as illustrated in Table 2. Remaining bit lines are kept at high impedance conditions during read operations as shown in Table 2.

The case shown is for NMOS implementations of a bitcell. Similar implementation can be done for PMOS type of column multiplexer of 8 is illustrated, with Y0 to Y7 being addresses decoded from a column decoder. A three bit scenario is shown including BIT0, BIT1, and BIT2. RD represents read operation on the bit lines. Z represents a high impedance state in case of an NMOS type ROM bitcell implementation.

In this embodiment, one extra track per column multiplexer is required (BLt track as shown in FIG. 9 and Table 2) in order to avoid logical conflicts due to a path created to virtual ground. This extra track has an additional advantage in that no horizontal connection crosses the bit boundary. Detailed programming of various data stored inside the bitcell is discussed herein.

Although generally a high impedance state is required where shown, regarding table 2, the Z content is not mandatory and some of the Z data shown can be made 0 (for particular Y values) without affecting the operation of bitcell. The minimum requirement is shown here.

As illustrated in FIG. 9, in order to read BL0, BL1 and BL2 have to be grounded. In combination with this, a third bit line track, Blt is used to isolate two bits, BIT0 and BIT1. Different from Table 1, the do not care X values become Z. Z means that the previous "do not care" tracks should not be driven through any signal, they must be made to float via the VGGC.

Reading data in this embodiment is different than in other embodiments. In this embodiment, the VGGC has to ensure that the remaining BL remains in the high impedance state rather than weekly driven by parasitics, thus not driven. If driven, the desired BL to be read will store the wrong data. Apart from that, another track is required vertically after every 8 BLs, or 16 BLs, depending on the scaling, in order to not scale incorrect data. In previous embodiments, an additional track was not required.

When performing a read operation on BL1, for example, the VGGC must ensure that on the other side of BL0 and Blt track should be zero, to read a correct zero. To read from any one BL, three ground connections must be made. In this embodiment, none of these ground connections are a dedicated ground of Vgnd line. Two bitcells may be read using a single MOS transistor using all bit line tracks to read from the bitcells, with the neighboring columns being kept at ground or a high impedance state based on the programming associated with Table 2.

Figure 10A:
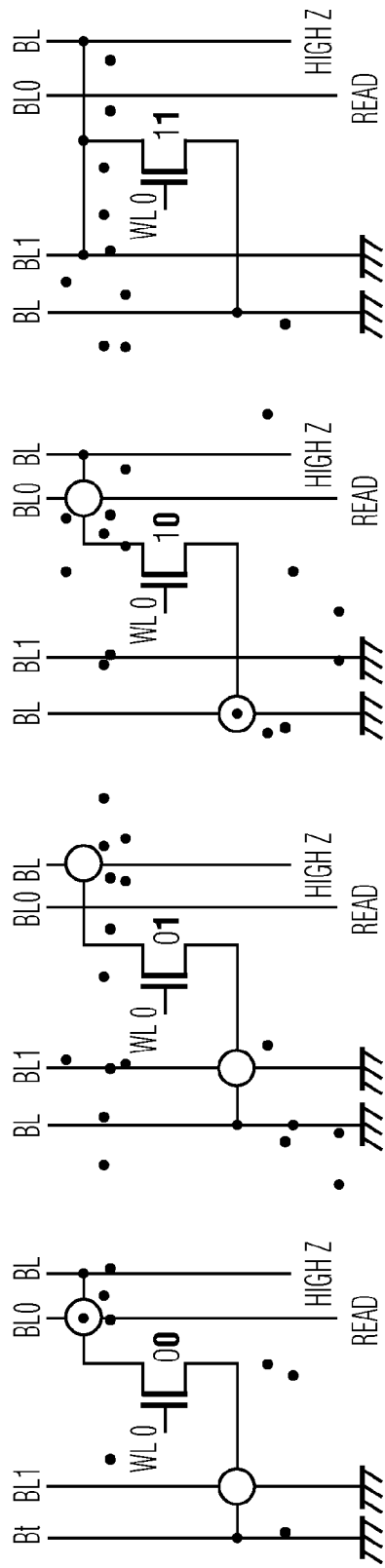
FIGS. 10A and 10B illustrate schematic diagrams of different read configurations in accordance with FIG. 7.
Figure 10B:
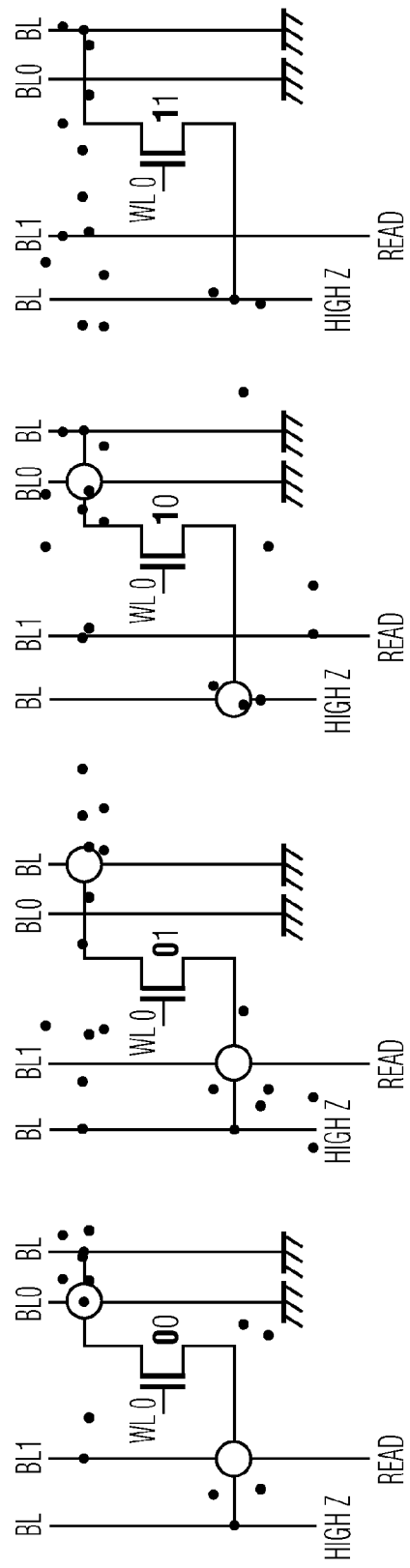

FIGS. 10A and 10B illustrate schematic diagrams of different read configurations in accordance with FIG. 7. These figures illustrate various possible combinations of data which can be stored in bitcell. This is a representation of a single bitcell that can store two data as shown next to the MOS. The data being read is shown in bold.

For example, reading the bit BL0 at 00, BL1 and BL (left) must be grounded, and BL(right) must be at a high impedance state Z. The high Z will be programmed with the VGGC. Care must be taken that BL(right) is not being driven through any MOS transistor, so as not to negatively affect the outcome.

Comparisons were performed with the parallel bitcells illustrated in FIGS. 1 and 2 and further embodiments described herein.

Figure 11:
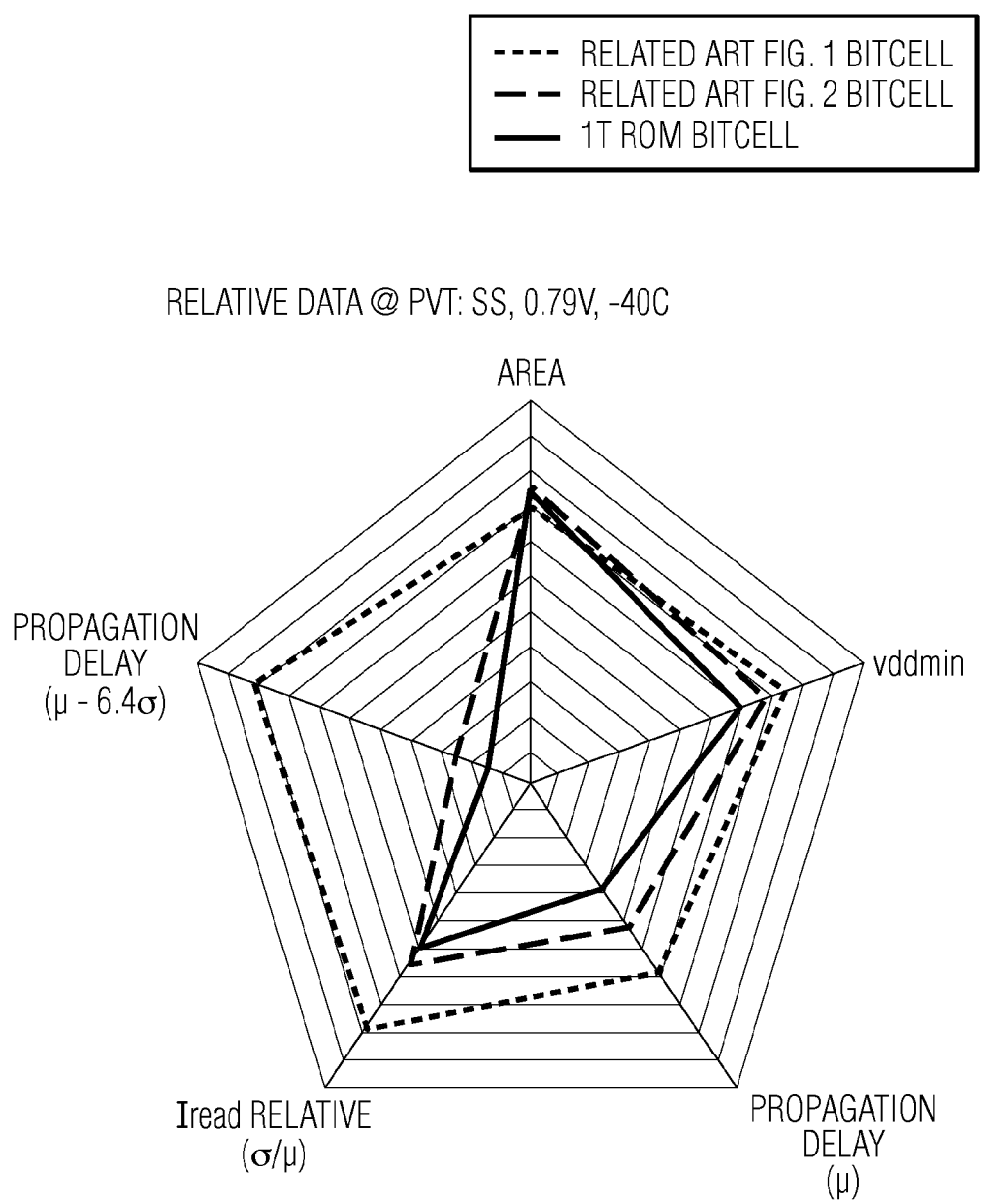
FIG. 11 illustrates a pentagonal graph comparing device parameters in accordance with embodiments described herein.

FIG. 11 illustrates a pentagonal graph comparing device parameters of related art FIG. 1, related art FIG. 2 and device parameters of the 1T ROM bitcell in accordance with embodiments described herein. In the graph, comparisons were measured and are displayed to compare propagation delay, cell current, spread ON current, area and Vddmin. Smaller values represent better characteristics of the device. Regarding embodiments that store two bits per transistor described herein, all of the characteristics are improved. Read current is a characteristic for a ROM bitcell. High current drives a high speed device, allowing voltage levels to be kept down. In embodiments described herein, a same read current may be obtained that was previously only obtained at higher voltages.

Thus in embodiments described herein, by using a bigger cell, memory reliability is significantly increased, speed is increased, and variability is reduced. Minimum channel width is not being implemented for the ROM in embodiments described herein. Size can be around 2 times larger than the minimum channel width that processing technology allows. Though the size may be larger, there is no sacrifice in area, because two bits of information are being stored on one physical MOS, so no data is lost.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware including several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A ROM memory device, comprising:
a plurality of rows and columns of memory cells, each memory cell including a bit line pair and a transistor to store two bits of data therein; and
a virtual ground line disposed between adjacent pairs of bit line pairs, wherein the bit line pair and virtual ground line are configured to read data stored in the memory cells.

2. The ROM memory device of claim 1, wherein each bit line of a bit line pair doubles as a virtual ground line.

3. The ROM memory device of claim 1, wherein the virtual ground line is a dedicated virtual ground line.

4. The ROM memory device of claim 1, comprising at least one column of memory cells that include a bit line pair.

5. The ROM memory device of claim 1, wherein a first bit line of the bit line pair is grounded in order to read data from a second bit line of the bit line pair.

6. The ROM memory device of claim 1, wherein the transistor is an NMOS or a PMOS transistor.

7. The ROM memory device of claim 1, comprising a virtual ground generation circuit to control polarities of the bit line pairs.

8. The ROM memory device of claim 1, comprising a column multiplexer having a predetermined number of inputs, wherein the bit line pair and virtual ground line are inputs of the column multiplexer.

9. The ROM memory device of claim 8, wherein inputs to the column multiplexer that are not grounded or being read are in a do not care state.

10. The ROM memory device of claim 1, wherein a memory cell is read by controlling the virtual ground line and a polarity of a first bit line of the bit line pair in order to read a value of a data bit on a second bit line of the bit line pair.

11. The ROM memory device of claim 10, comprising a virtual ground generation circuit to control the polarity of the first bit line.

12. The ROM memory device of claim 10, wherein the virtual ground line, first bit line and second bit line are inputs to a column multiplexer having a predetermined number of inputs.

13. The ROM memory device of claim 12, wherein a plurality of do not care values are read from the plurality of predetermined inputs that are not being read or virtually grounded.

14. The ROM memory device of claim 1, wherein the virtual ground line and a second bit line are controlled in order to read a value of a data bit on a first bit line.

15. A ROM memory device, comprising:
a plurality of column multiplexers having a plurality of rows and columns of memory cells including:
a transistor to store two bits of data therein;
a plurality of bit line pairs, each bit line pair including a first bit line and a second bit line on either side of the transistor; and
an additional bit line disposed between pairs of column multiplexers.

16. The ROM memory device of claim 15, wherein multiple bit lines are used to read the two bits stored in the transistor.

17. The ROM memory device of claim 15, wherein three bit lines are virtually grounded to read data stored on a fourth bit line.

18. The ROM memory device of claim 15, wherein data read from multiple bit lines are multiplexed to form a single output bit.

19. The ROM memory device of claim 15, wherein bit line inputs to a column multiplexer that are not virtually grounded or read are kept at a high impedance state.

20. The ROM memory device of claim 15, comprising a virtual ground generation circuit to program values of the bit lines.

* * * * *